(12) United States Patent
Nagano et al.

(10) Patent No.: US 8,835,933 B2
(45) Date of Patent: Sep. 16, 2014

(54) RECESSED GATE-TYPE SILICON CARBIDE FIELD EFFECT TRANSISTOR AND METHOD OF PRODUCING SAME

(75) Inventors: Takahiro Nagano, Tsukuba (JP); Mitsuo Okamoto, Tsukuba (JP); Tsutomu Yatsuo, Tsukuba (JP); Kenji Fukuda, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 76 days.

(21) Appl. No.: 13/392,786

(22) PCT Filed: Aug. 27, 2010

(86) PCT No.: PCT/JP2010/064613
§ 371 (c)(1),
(2), (4) Date: Feb. 27, 2012

(87) PCT Pub. No.: WO2011/024956
PCT Pub. Date: Mar. 3, 2011

(65) Prior Publication Data
US 2012/0153302 A1    Jun. 21, 2012

(30) Foreign Application Priority Data
Aug. 28, 2009  (JP) .................. 2009 197601

(51) Int. Cl.
| | |
|---|---|
| *H01L 29/15* | (2006.01) |
| *H01L 21/336* | (2006.01) |
| *H01L 29/78* | (2006.01) |
| *H01L 29/66* | (2006.01) |
| *H01L 29/16* | (2006.01) |

(52) U.S. Cl.
CPC ......... *H01L 29/7834* (2013.01); *H01L 29/1608* (2013.01); *H01L 29/66068* (2013.01)

USPC 257/77; 257/330; 257/E21.006; 257/E29.104; 438/270

(58) Field of Classification Search
CPC .................. H01L 29/1608; H01L 29/66068; H01L 29/7813; H01L 29/7834; H01L 21/02378
USPC .................. 257/77, 330, E29.104, E21.066; 438/270
See application file for complete search history.

(56) References Cited

U.S. PATENT DOCUMENTS

| | | | | |
|---|---|---|---|---|
| 2001/0038108 | A1* | 11/2001 | Kitabatake et al. | 257/289 |
| 2003/0042538 | A1* | 3/2003 | Kumar et al. | 257/328 |

(Continued)

FOREIGN PATENT DOCUMENTS

| | | |
|---|---|---|
| JP | 47-31875 B | 8/1972 |
| JP | 2-51276 A | 2/1990 |

(Continued)

OTHER PUBLICATIONS

International Search Report issued in PCT/JP2010/064613, dated Nov. 22, 2010.

(Continued)

*Primary Examiner* — Steven J Fulk
(74) *Attorney, Agent, or Firm* — Birch, Stewart, Kolasch & Birch, LLP (57) ABSTRACT

A SiC MISFET, in which a source region and a drain region (3, 4) are formed in a one-conductivity-type SiC semiconductor region (2), in which a recess (5) with a predetermined depth is formed in a portion of the SiC semiconductor region sandwiched between the source and drain regions, with the recess having two side faces in contact with the source and drain regions, and a bottom face connecting the two side faces, and in which portions (3a, 4a) of the source and drain regions adjacent to the vicinity of both ends of the bottom face of the recess are thinner than other portions.

18 Claims, 6 Drawing Sheets

(56) References Cited

U.S. PATENT DOCUMENTS

| | | | |
|---|---|---|---|
| 2003/0075719 A1* | 4/2003 | Sriram | 257/77 |
| 2004/0145011 A1* | 7/2004 | Hsu et al. | 257/330 |
| 2004/0183080 A1* | 9/2004 | Kusumoto et al. | 257/77 |
| 2005/0077569 A1* | 4/2005 | Yamashita et al. | 257/330 |
| 2006/0068537 A1* | 3/2006 | Hayashi et al. | 438/197 |
| 2008/0203441 A1 | 8/2008 | Endo | |
| 2010/0224884 A1* | 9/2010 | Seki et al. | 257/77 |
| 2011/0186862 A1 | 8/2011 | Harada et al. | |

FOREIGN PATENT DOCUMENTS

| | | |
|---|---|---|
| JP | 2-94477 A | 4/1990 |
| JP | 4-306881 A | 10/1992 |
| JP | 7-38095 A | 2/1995 |
| JP | 2000-208762 A | 7/2000 |
| JP | 2002-124669 A | 4/2002 |
| JP | 2007-19513 A | 1/2007 |
| JP | 2007-103729 A | 4/2007 |
| JP | 2008042018 A * | 2/2008 |
| JP | 2008-244456 A | 10/2008 |
| JP | 2008-311406 A | 12/2008 |
| JP | 2009-158933 A | 7/2009 |

OTHER PUBLICATIONS

Japanese Office Action, dated Apr. 23, 2013, for Application No. 2009-197601 with English language translation.

Japanese Office Action, dated Aug. 6, 2013, for Application No. 2009-197601 with English language translation.

Japanese Notice of Reasons for Rejection dated Apr. 30, 2014 for Japanese Application No. 2013-229475 with English language translation.

* cited by examiner

RECESSED GATE-TYPE SILICON CARBIDE FIELD EFFECT TRANSISTOR AND METHOD OF PRODUCING SAME

TECHNICAL FIELD

The present invention relates to a silicon carbide field effect transistor that is low in an on-resistance and is preferable for reduction of a gate length and to a method of producing the same, and specifically to a silicon carbide field effect transistor using a recessed gate structure and to a method of producing the same.

BACKGROUND ART

Silicon carbide (SiC) has excellent physical properties, such as a wider band gap, a higher breakdown field intensity, and a larger saturation drift velocity of electrons, as compared with silicon (Si). Thus, use of SiC as the starting constitutive material makes it possible to fabricate a semiconductor device for use with an electrical power of high withstand voltage and low resistance exceeding the limits of Si. Further, similar to Si, SiC has such a characteristic to allow forming an insulating layer through thermal oxidation. Based on these, it is supposed to be possible to realize an insulated gate-type field effect transistor (hereinafter, MISFET, typically known as a MOSFET) with a high withstand voltage and a low on-resistance, in which use is made of a single crystal of SiC as the material. Numerous researches and developments directed to this device have been under path.

Further, SiC is known to have an excellent transient response characteristic, and can be used in a high frequency region exceeding 100 kHz. Thus, it can be used to fabricate a power IC with high frequency and high power density, which cannot be realized with Si. Such a performance is preferable for making a logic circuit into an IC, as well as the power IC.

Figure 17:
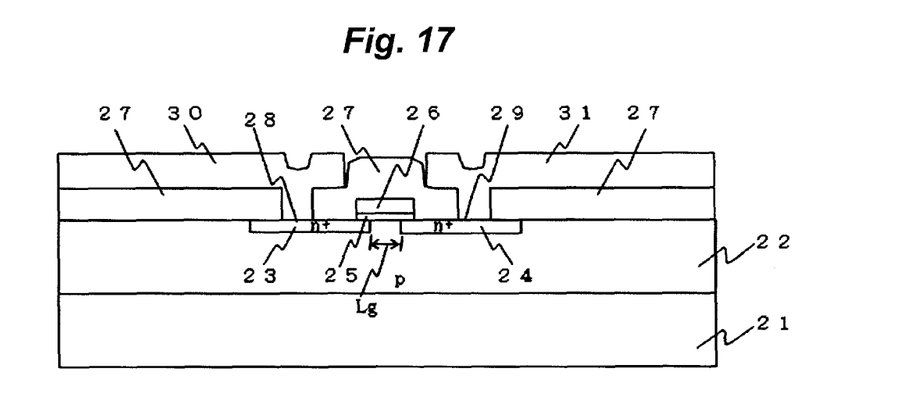
FIG. 17 is a cross-sectional view showing a conventional SiC MISFET.

As shown in FIG. 17, a conventional SiC MISFET includes a SiC substrate 21, a SiC semiconductor region 22 formed of a p-type epitaxial layer formed on the SiC substrate 21, n+ type source region 23 and drain region 24 formed in the SiC semiconductor region 22, a gate insulating layer 25 formed to extend over the source region 23 and the drain region 24 on a surface of the p-type SiC semiconductor region 22, a gate electrode 26 provided on the gate insulating layer 25, an insulating layer 27 formed on the surface of the SiC semiconductor region 22, and a source electrode 30 and a drain electrode 31 electrically connected to the source region 23 and the drain region 24, respectively, formed through openings (contact regions 28 and 29) provided in the insulating layer 27. For example, the size of the conventional SiC MISFET is: a gate length Lg (which is equal to a channel length herein; hereinafter, "gate length" and "channel length" are treated as having the same meaning) of 3 µm, a thickness of a gate oxide layer of 40 nm, and depths of the source and drain regions of 300 nm. In such a device, the respective sheet resistance of the source and drain regions, which is parasitic resistance, is about 13 kΩ per square. In the SiC MISFET, on-resistance can be reduced by two orders of magnitude as compared with a Si MISFET. The reduction of the on-resistance becomes an important factor for improvement in device performance.

Further, when a MISFET is to be fabricated, the fabrication is performed in a non-self alignment manner in a SiC process, as disclosed in Patent Literature 1. This is because, since a temperature of activation annealing performed after impurity ion implantation is higher (about 1,600° C.) than that in a Si process and the gate oxide layer is not resistant to such a high temperature treatment, the gate oxide layer and the gate electrode are formed through separate mask alignments after impurity region formation by the ion implantation.

CITATION LIST

Patent Literature

Patent Literature 1: JP-A-2008-244456 ("JP-A" means unexamined published Japanese patent application) (pages 11-13, FIGS. 1 to 3)

SUMMARY OF INVENTION

Technical Problem

In a SiC MISFET, on-resistance can be reduced by two orders of magnitude as compared with a Si MISFET. The reduction of the on-resistance becomes an important factor for improvement in device performance. A straightforward approach to reduce the on-resistance is to make the gate length (=channel length) short. However, generally, when a MISFET with a short gate length is fabricated, it is necessary to reduce (scale down) the thickness of the gate insulating layer (oxide layer) and to reduce the depths of the source and drain regions, as well as the gate length. If the conventional SiC MISFET as shown in FIG. 17, in which the gate length is 3 µm, the thickness of the gate oxide layer is 40 nm, and the depths of the source and drain regions are 300 nm, is made to have the gate length of 1 µm, the gate oxide layer is reduced to 13 nm and the depths of the source and drain regions are reduced to 100 nm. As a result, the on-resistance is reduced due to the short gate length, but sheet resistance in the source and drain regions, which is another primary component constituting the on-resistance, increases from 13 kΩ per square to 20 kΩ per square. Accordingly, an effect of the on-resistance reduction due to the reduced gate (channel) length is cancelled out, which is a problem. Conversely, if the gate (channel) length is reduced with the source and drain regions maintained at a certain depth, the sheet resistance component may be reduced, but there is a possibility of another problem that the short-channel effects occur and controlling of a threshold voltage (Vth) of the device becomes difficult.

Further, when a MISFET is to be fabricated, self alignment technology generally used in a Si MISFET fabrication process is unavailable in the SiC process. Accordingly, it is difficult to realize a MISFET with a short gate (channel) length due to a restriction that fabrication must be performed in a non-self alignment manner as disclose in Patent Literature 1. That is, this is because, in the SiC process, a temperature for activation annealing performed after impurity ion implantation is higher (about 1,500° C.) than that in the Si process and the gate insulating layer is not resistant to such a high temperature treatment, and thus formation of the gate insulating layer and the gate electrode is performed in a non-self alignment manner after impurity region formation by ion implantation.

The present invention has been made in view of the problems described above, and is to provide a SiC MISFET low in on-resistance, that is, the present invention is contemplated for providing a SiC MISFET capable of suppressing short-channel effects even when a short channel length is achieved.

Further, the present invention is contemplated for providing a method of producing a SiC MISFET, enabling realization of a device with a short gate (channel) length even when a non-self-alignment fabrication process is used.

Solution to Problem

According to the present invention, there is provided the following means:

<1> A recessed gate-type silicon carbide field effect transistor, comprising:
a substrate (1) including a one-conductivity-type silicon carbide semiconductor region (2) having one main face;
a source region and a drain region (3, 4, 13, 14) of an opposite-conductivity-type to the one-conductivity-type that are formed in contact with the one main face and spaced from each other in the one-conductivity-type silicon carbide semiconductor region (2);
a recess (5, 15) formed in the one main face side of the one-conductivity-type silicon carbide semiconductor region (2) sandwiched between facing edges of the spaced source and drain regions (3, 4, 13, 14), the recess consisting of a first side face in contact with the source region (3, 13), a second side face in contact with the drain region (4, 14), and a bottom face that is located at a predetermined depth from the one main face, continues to the first and second side faces, and connects the spaced source and drain regions (3, 4, 13, 14);
an insulating layer (6, 16) covering a portion of the one main face with which the source and drain regions (3, 4, 13, 14) are in contact, and formed on the first and second side faces and the bottom face of the recess (5, 15);
a gate electrode (7) formed on the insulating layer (6, 16); and
a source electrode and a drain electrode (11, 12) electrically connected to the source and drain regions (3, 4, 13, 14),
wherein a channel forming region is constituted at a portion of the silicon carbide semiconductor region adjacent to the bottom face connecting the source and drain regions (3, 4, 13, 14).

<2> The recessed gate-type silicon carbide field effect transistor according to <1>, comprising:
a substrate (1) including a one-conductivity-type silicon carbide semiconductor region (2) having one main face;
a source region and a drain region (3, 4) of an opposite-conductivity-type to the one-conductivity-type that are formed in contact with the one main face and spaced from each other in the one-conductivity-type silicon carbide semiconductor region (2);
a recess (5) formed in the one main face side of the one-conductivity-type silicon carbide semiconductor region (2) sandwiched between facing edges of the spaced source and drain regions (3, 4), the recess consisting of a first side face in contact with the source region (3), a second side face in contact with the drain region (4), and a bottom face that is located at a predetermined depth from the one main face, continues to the first and second side faces, and connects the spaced source and drain regions (3, 4);
an insulating layer (6) covering a portion of the one main face with which the source and drain regions (3, 4) are in contact, and formed on the first and second side faces and the bottom face of the recess (5);
a gate electrode (7) formed on the insulating layer (6); and
a source electrode and a drain electrode (11, 12) electrically connected to the source and drain regions (3, 4),
wherein a channel forming region is constituted at a portion of the silicon carbide semiconductor region adjacent to the main portion of the bottom face connecting the source and drain regions (3, 4), and
wherein portions in the vicinity of both ends of the bottom face are in contact with thin regions (3a, 4a) of the source and drain regions.

<3> The recessed gate-type silicon carbide field effect transistor according to <1>, comprising:
a substrate (1) including a one-conductivity-type silicon carbide semiconductor region (2) having one main face;
a source region and a drain region (13, 14) of an opposite-conductivity-type to the one-conductivity-type that are formed in contact with the one main face, spaced from each other, and formed with a first predetermined depth from the one main face, in the one-conductivity-type silicon carbide semiconductor region (2);
a recess (15) formed in the one main face side of the one-conductivity-type silicon carbide semiconductor region (2) sandwiched between facing edges of the spaced source and drain regions (13, 14), the recess consisting of a first side face in contact with the source region (13) and having substantially the same depth as the first predetermined depth, a second side face in contact with the drain region (14) and having substantially the same depth as the first predetermined depth, and a bottom face that is located at a second predetermined depth from the one main face, continues to the first and second side faces, and connects the spaced source and drain regions (13, 14);
an insulating layer (16) covering a portion of the one main face with which the source and drain regions (13, 14) are in contact, and formed on the first and second side faces and the bottom face of the recess (15);
a gate electrode (7) formed on the insulating layer (16); and
a source electrode and a drain electrode (11, 12) electrically connected to the source and drain regions (13, 14),
wherein a channel forming region is constituted at a portion of the silicon carbide semiconductor region adjacent to over an entire length of the bottom face connecting the source and drain regions (13, 14), and
wherein the second predetermined depth is selected to be approximately the same as or smaller than the first predetermined depth.

<4> The recessed gate-type silicon carbide field effect transistor according to <1>, comprising:
a substrate (1) including a one-conductivity-type silicon carbide semiconductor region (2) having one main face;
a source region and a drain region (3, 4, 13, 14) of an opposite-conductivity-type to the one-conductivity-type that are formed in contact with the one main face and spaced from each other in the one-conductivity-type silicon carbide semiconductor region (2);
a recess (5, 15) formed in the one main face side of the one-conductivity-type silicon carbide semiconductor region (2) sandwiched between facing edges of the spaced source and drain regions (3, 4, 13, 14), the recess consisting of a first side face in contact with the source region (3, 13), a second side face in contact with the drain region (4, 14), and a bottom face that is located at a predetermined depth from the one main face, continues to the first and second side faces, and connects the spaced source and drain regions (3, 4, 13, 14);
an insulating layer (6, 16) covering a portion of the one main face with which the source and drain regions (3, 4, 13, 14) are in contact, and formed on the first and second side faces and the bottom face of the recess (5, 15);
a gate electrode (7) formed on the insulating layer (6, 16); and
a source electrode and a drain electrode (11, 12) electrically connected to the source and drain regions (3, 4, 13, 14),
wherein a channel forming region is constituted at a portion of the silicon carbide semiconductor region adjacent to the bottom face connecting the source and drain regions (3, 4, 13, 14), and
wherein regions (17, 17) of the one-conductivity-type are formed in the source and drain regions (3, 4, 13, 14) beneath the gate electrode (7) formed on the insulating layer (6, 16) covering the portion of the one main face.

<5> The recessed gate-type silicon carbide field effect transistor according to <1> or <2>, comprising:

a substrate (1) including a one-conductivity-type silicon carbide semiconductor region (2) having one main face;

a source region and a drain region (3, 4) of an opposite-conductivity-type to the one-conductivity-type that are formed in contact with the one main face and spaced from each other in the one-conductivity-type silicon carbide semiconductor region (2);

a recess (5) formed in the one main face side of the one-conductivity-type silicon carbide semiconductor region (2) sandwiched between facing edges of the spaced source and drain regions (3, 4), the recess consisting of a first side face in contact with the source region (3), a second side face in contact with the drain region (4), and a bottom face that is located at a predetermined depth from the one main face, continues to the first and second side faces, and connects the spaced source and drain regions (3, 4);

an insulating layer (6) covering a portion of the one main face with which the source and drain regions (3, 4) are in contact, and formed on the first and second side faces and the bottom face of the recess (5);

a gate electrode (7) formed on the insulating layer (6); and a source electrode and a drain electrode (11, 12) electrically connected to the source and drain regions (3, 4), wherein a channel forming region is constituted at a portion of the silicon carbide semiconductor region adjacent to the main portion of the bottom face connecting the source and drain regions (3, 4), wherein portions in the vicinity of both ends of the bottom face are in contact with thin regions (3a, 4a) of the source and drain regions (3, 4), and wherein regions (17, 17) of the one-conductivity-type are formed in the surface portions of the source and drain regions (3, 4) beneath the gate electrode (7) formed on the insulating layer covering the portion of the one main face.

<6> The recessed gate-type silicon carbide field effect transistor according to <1> or <3>, comprising:

a substrate (1) including a one-conductivity-type silicon carbide semiconductor region (2) having one main face;

a source region and a drain region (13, 14) of an opposite-conductivity-type to the one-conductivity-type that are formed in contact with the one main face, spaced from each other, and formed with a first predetermined depth from the one main face, in the one-conductivity-type silicon carbide semiconductor region (2);

a recess (15) formed in the one main face side of the one-conductivity-type silicon carbide semiconductor region (2) sandwiched between facing edges of the spaced source and drain regions (13, 14), the recess consisting of a first side face in contact with the source region (13) and having substantially the same depth as the first predetermined depth, a second side face in contact with the drain region (14) and having substantially the same depth as the first predetermined depth, and a bottom face that is located at a second predetermined depth from the one main face, continues to the first and second side faces, and connects the spaced source and drain regions (13, 14);

an insulating layer (16) covering a portion of the one main face with which the source and drain regions (13, 14) are in contact, and formed on the first and second side faces and the bottom face of the recess (15);

a gate electrode (7) formed on the insulating layer (16); and a source electrode and a drain electrode (11, 12) electrically connected to the source and drain regions (13, 14), wherein a channel forming region is constituted at a portion of the silicon carbide semiconductor region adjacent to over an entire length of the bottom face connecting the source and drain regions (13, 14), wherein the second predetermined depth is selected to be approximately the same as or smaller than the first predetermined depth, and wherein regions (17, 17) of the one-conductivity-type are formed in the surface portions of the source and drain regions (13, 14) beneath the gate electrode (7) formed on the insulating layer (16) covering the portion of the one main face.

<13> A method of producing a recessed gate-type silicon carbide field effect transistor, comprising the steps of:

providing a substrate including a one-conductivity-type silicon carbide semiconductor region having one main face;

selectively forming a source region and a drain region of an opposite-conductivity-type to the one-conductivity-type at a first predetermined depth from the one main face in the one-conductivity-type silicon carbide semiconductor region, with the source and drain regions being in contact with the one main face and spaced from each other;

selectively removing silicon carbide in a portion at which the spaced source and drain regions face each other, thereby to form a recess, with the recess consisting of a first side face in contact with the source region, a second side face in contact with the drain region, and a bottom face that is located at a second predetermined depth from the one main face, continues to the first and second side faces, and connects the spaced source and drain regions;

forming a first insulating layer that covers a portion of the one main face with which the source and drain regions are in contact, and is continuous on the first and second side faces and the bottom face of the recess;

forming a gate electrode on the insulating layer;

forming a second insulating layer that covers other portion of the one main face with which the source and drain regions are in contact;

selectively removing the second insulating layer, thereby to form openings on the source and drain regions, respectively; and forming a source electrode and a drain electrode electrically connected to the source and drain regions through the openings, respectively.

<17> A method of producing a recessed gate-type silicon carbide field effect transistor, comprising the steps of:

providing a substrate including a one-conductivity-type silicon carbide semiconductor region having one main face;

selectively forming a region of an opposite-conductivity-type to the one-conductivity-type at a first predetermined depth from the one main face in the one-conductivity-type silicon carbide semiconductor region, with the region being in contact with the one main face;

selectively removing silicon carbide in a portion of the region of the opposite-conductivity-type type to an approximately equal depth to the first predetermined depth, thereby to form a recess and to define a source region and a drain region of the opposite-conductivity-type to the one-conductivity-type that face each other and are spaced from each other, with the recess consisting of a first side face and a second side face each in contact with the region of the opposite-conductivity-type and a bottom face to which the first and second side faces continue;

forming a first insulating layer that covers a portion of the one main face with which the source and drain regions are in contact, and is continuous on the first and second side faces and the bottom face of the recess;

forming a gate electrode on the insulating layer;

forming a second insulating layer that covers other portion of the one main face with which the source and drain regions are in contact;

selectively removing the second insulating layer, thereby to form openings on the source and drain regions, respectively; and forming a source electrode and a drain electrode electrically connected to the source and drain regions through the openings, respectively.

Advantageous Effects of Invention

According to the recessed gate-type silicon carbide field effect transistor and the method of producing the same of the present invention, the following advantageous effects are exhibited.

That is, by employing a recessed gate structure, since the respective depth of the source region and drain region adjacent to the gate electrode can be selectively thin or be substantially zero, the short-channel effects can be suppressed and a SiC MISFET can be obtained which is low in on-resistance owing to a short gate length (channel length). Since the respective depth of the source region and drain region apart from a portion adjacent to the gate electrode need not be thin, there is no concern of increase in sheet resistance of the source and drain regions, and thus the on-resistance of the resultant device can be reduced. As a result, the SiC MISFET according to the present invention is preferable as a component element of a power IC, or an integrated, high-speed logic circuit IC.

Further, it is possible to fabricate a SiC MISFET with a short gate length (channel length) without use of self alignment.

Other and further features and advantages of the invention will appear more fully from the following description, appropriately referring to the accompanying drawings.

BRIEF DESCRIPTION OF DRAWINGS

{FIG. 1}
{FIG. 2}
{FIG. 3}
{FIG. 4}
{FIG. 5}
{FIG. 6}
{FIG. 7}
{FIG. 8}
{FIG. 9}
{FIG. 10}
{FIG. 11}
{FIG. 12}
{FIG. 13}
{FIG. 14}
{FIG. 15}
{FIG. 16}
{FIG. 17}

MODE FOR CARRYING OUT THE INVENTION

Hereinafter, examples of preferred embodiments to carry out the present invention will be described in detail with reference to the appended drawings. Note that, in the drawings for explaining the embodiments, elements that have substantially the same function and structure are denoted with the same reference signs, and repeated explanation is omitted, unless otherwise specified.

[Embodiment 1]

Figure 1:
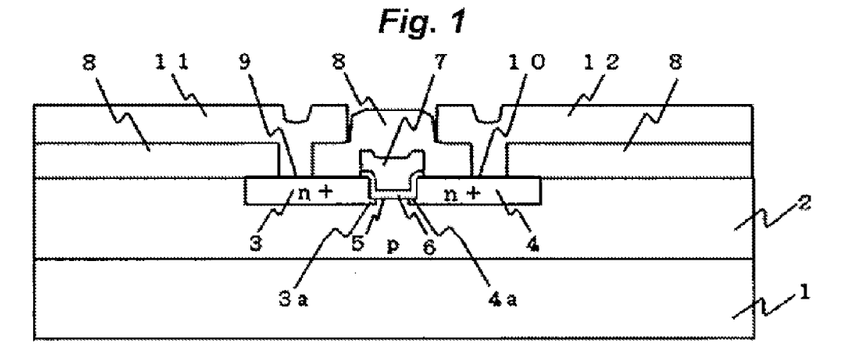
FIG. 1 is a cross-sectional view taken along A-A' of FIG. 2, which shows an example of a SiC MISFET to which Embodiment 1 of the present invention is applied.
Figure 2:
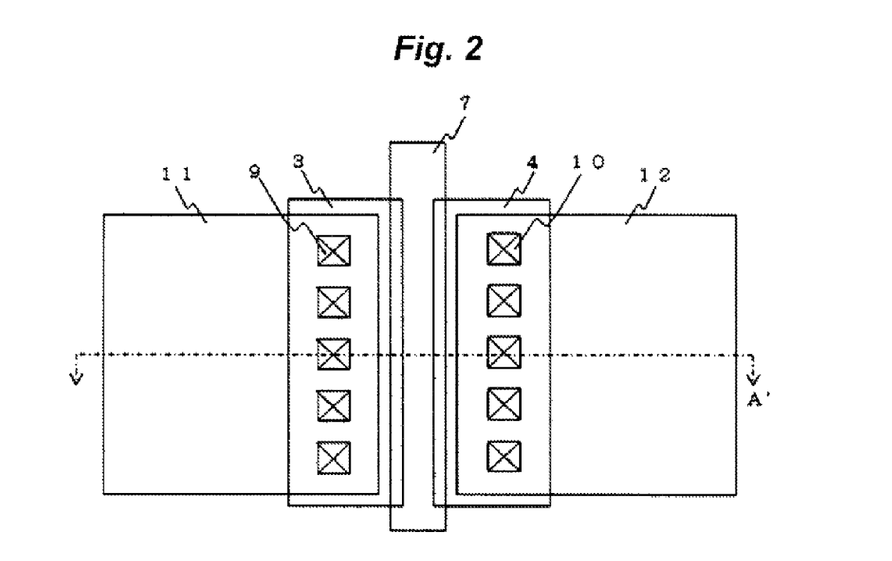
FIG. 2 is a plan view showing the SiC MISFET shown in FIG. 1.

FIGS. 1 and 2 show an example of a SiC MISFET according to Embodiment 1. FIG. 1 is an enlarged cross-sectional view, and FIG. 2 is a plan view of the same device (FIG. 1 is a cross-sectional view taken along a dot and dash line of FIG. 2). A base having a p-type SiC semiconductor region 2 formed on a SiC substrate 1 is provided, and n+ type source and drain regions 3, 4 adjacent to one main face of the SiC semiconductor region 2 and spaced from and facing each other are provided in the SiC semiconductor region 2. Herein, the SiC substrate 1 is of any of a p-type, n-type or semi-insulating-type, and a crystal face of the SiC substrate 1 may be a (0001) Si face or a (000-1) C face, or may have another face orientation. Further, the p-type SiC semiconductor region 2 is an active layer having a region constituting the device formed therein, and is, for example, composed of an epitaxial grown layer doped with an impurity concentration of about $5\times10^{15}/cm^3$ with a thickness of 10 μm. The impurity concentration of the source and drain regions 3, 4 is about $1\times10^{20}/cm^3$ and the respective depth of the source and drain regions 3, 4 is 250 nm. A spacing distance (facing interval) of the source and drain regions 3, 4 is 1 μm. That is, this distance defines a gate length Lg (channel length).

It is common to respective embodiments of the present invention that there is a recessed gate structure composed of a recess provided in the SiC semiconductor region, a gate insulating layer that covers the recess, and a gate electrode formed thereon. In Embodiment 1, the recess 5 is formed at one main face side of the semiconductor region 2 between facing edges of the source and drain regions 3, 4 (end edges of the source and drain regions on the one main face of the semiconductor region 2). The recess 5 is constituted with two side faces that are in contact with the source and drain regions 3, 4, respectively, and a bottom face that is located at a predetermined depth from the one main face, is continued to the two side faces, and connects the spaced source and drain regions 3, 4. In this example, the recess (concave portion) may be formed with width 2 μm and depth 150 nm.

A gate insulating layer 6 may be a silicon oxide layer, and a thickness of the gate insulating layer 6 is, for example, 13 nm. In FIG. 1, as the gate insulating layer 6, use is made of a layer having a uniform thickness over the bottom face and the two side faces of the recess and over the surface of the respective portion of the source and drain regions 3, 4, but the present invention is not limited thereto. For example, the gate insulating layer on the surface of the respective portion of the source and drain regions 3, 4 may be thicker than that in the recess. Accordingly, increase in capacitance resulting from overlap of the gate electrode and the source and drain regions can be suppressed.

The gate electrode 7 may be formed of a polysilicon material and may be doped with an n-type impurity at about $1 \times 10^{20}/cm^3$.

In the structure of FIG. 1, the respective portion of the source and drain regions 3, 4 beneath the vicinity of both ends of the bottom face of the recess 5 exist as thinner regions 3a, 4a. Further, the respective portion of the source and drain regions 3, 4 beneath the source and drain electrodes 11, 12 are maintained relatively thicker. As a result, such a SiC MISFET has characteristics that short-channel effects can be suppressed even with a short gate length (channel length) and reduction of the on-resistance can be realized.

An insulating layer 8 is formed above the substrate 1 for formation of electrodes and wirings, and may be a silicon oxide layer. A field insulating layer is usually formed on the surface of the semiconductor region 2 on the substrate 1, prior to formation of the insulating layer 8, but is not shown herein.

The source electrode 11 and the drain electrode 12 are electrically connected to the source and drain regions 3, 4 through contact openings 9, 10, which are formed in the insulating layer 8. The contact openings 9, 10 each have a rectangular shape as shown in FIG. 2, and the size of the respective contact opening 9, 10 is 2 μm×2 μm. Further, the pitch of the contact openings in FIG. 2 is 4 μm. The gate electrode 7 is formed as a separate layer from the source and drain electrodes 11, 12. However, in fact, the gate electrode 7 is extended upward from the plan view of FIG. 2, and there, a gate extraction electrode is formed of the same material as the source and drain electrodes through another contact openings formed in the insulating layer 8.

[Embodiment 2]

Figure 3:
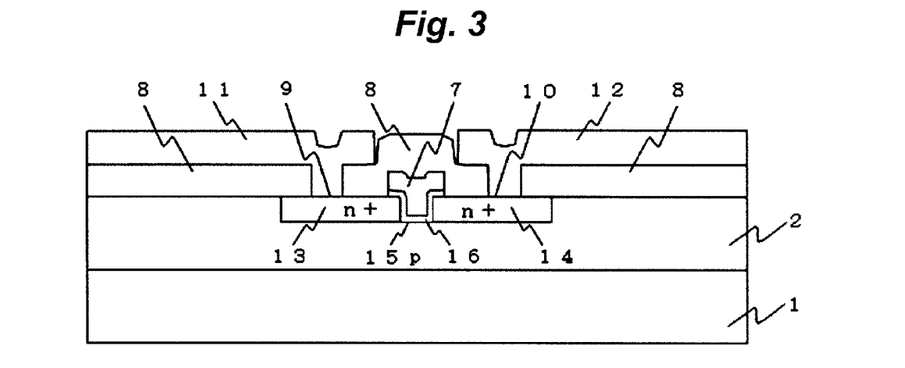
FIG. 3 is a cross-sectional view showing an example of a SiC MISFET to which Embodiment 2 of the present invention is applied.

FIG. 3 show an example of a SiC MISFET according to Embodiment 2. In this device, a depth at which the bottom face of the recess 15 is located from the one main face of the SiC semiconductor region 2 as the reference in depth, is set to be approximately equal to the depths of the source and drain regions. Ideally, it is preferable for the bottom face and the source and drain regions to have the equal depth (thickness), but it is difficult to make the depth (thickness) equal in terms of a fabrication process. Accordingly, the depth of the bottom face 15 of the recess is controlled to be slightly smaller than the depths of the source and drain regions 13, 14. This is because, when the depth of the bottom face is greater than the depths of the source and drain regions, the channel length exceeds a target value.

According to this structure, the depth of the respective portion of the source and drain regions, corresponding to 3a and 4a, respectively, of FIG. 1, can be smaller, and approximately zero. Thus, the short-channel effects can be further suppressed, which is a characteristic.

[Embodiment 3]

Figure 4:
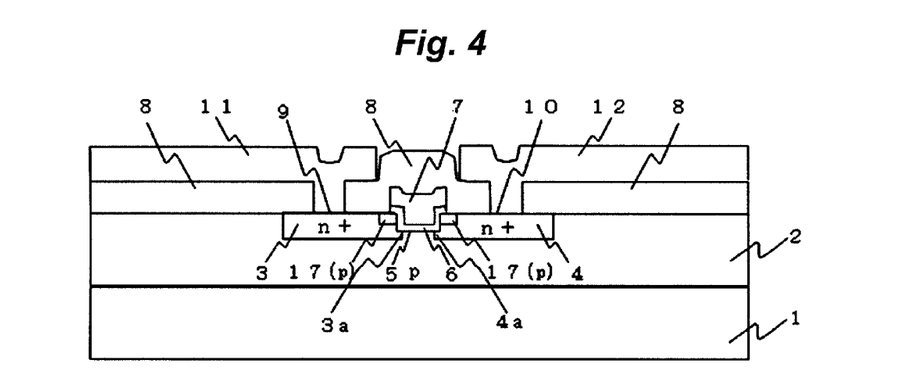
FIG. 4 is a cross-sectional view showing an example of a SiC MISFET to which Embodiment 3 of the present invention is applied.

FIG. 4 show an example of a SiC MISFET according to Embodiment 3. In this device, in addition to the device structure shown in FIG. 1, p-type gate capacitance relaxation regions 17, 17 are formed along edges of the source and drain regions in the respective surface portion of the source and drain regions 3, 4 overlapping the gate electrode 7 on the one main face of the SiC semiconductor region 2. Those regions 17, 17 each extend about 1 μm in a transverse direction (a direction parallel to the one main face of the semiconductor region 2) from ends of the recess, and have a depth of about 100 nm. Impurity concentration is $1 \times 10^{18}/cm^3$. In this case, electrostatic capacitances between the gate and the source and between the gate and the drain due to overlap of the gate electrode and the source and drain regions, are represented as summed capacitance, which is a serial connection of capacitance of the gate insulating layer and built-in capacitance of a pn junction. However, since the latter is smaller, the summed capacitance is determined mainly by the latter, such that gate electrode overlap capacitance can be reduced and a SiC MISFET having such a structure has a characteristic that the SiC MISFET can advantageously function as a component element of a high-speed logic circuit or a power electronics circuit with low power loss. This SiC MISFET is the best mode.

Hereinafter, effects achieved by providing the p-type capacitance relaxation regions on the surfaces of the n-type source and drain regions will be complementarily described based on a numerical example.

Capacitances $C_{GS}$ (between the gate and the source) and $C_{GD}$ (between the gate and the drain) between the gate electrode and the source or drain electrode, are represented by formula (1) ($C_{GS}$ and $C_{GD}$ are simple referred to as $C_{GS}$ herein, since they are equal):

$$\frac{1}{C_{GS}} = \frac{1}{C_{OX}} + \frac{1}{C_{bi}} \quad (1)$$

wherein $C_{OX}$ represents MOS capacitance between the gate electrode and the p-type capacitance relaxation region beneath the gate electrode with the gate insulating layer (oxide layer) sandwiched therebetween, and $C_{bi}$ represents built-in capacitance configured of a pn junction between the p-type capacitance relaxation region and the adjacent n-type source region (including the source electrode). $C_{OX}$ and $C_{bi}$ in formula (1) are represented as follows:

$$C_{OX} = \frac{\varepsilon_0 \cdot \varepsilon_{OX}}{t_{OX}} A \quad (2)$$

$$C_{bi} = \frac{\varepsilon_0 \cdot \varepsilon_{SiC}}{X_{bi}} A \quad (3)$$

$\varepsilon_0$: Electric constant=$8.854 \times 10^{-14}$ F/cm
$\varepsilon_{OX}$: Relative dielectric constant of oxide layer=11.8
$\varepsilon_{SiC}$: Relative dielectric constant of SiC=9.7
$t_{OX}$: Oxide layer thickness
A: Area
$X_{bi}$: Depletion layer width at built-in voltage= $(2\varepsilon_0 \cdot \varepsilon_{SiC} \cdot V_{bi}/q)^{1/2} \times (1/N_A + 1/N_D)^{1/2}$
$V_{bi}$: Built-in voltage=2.7V q: Elementary charge of electron=$1.602 \times 10^{-19}$ C
$N_A$: Acceptor concentration of p layer
$N_D$: Donor concentration of n layer
An example is calculated based on the following values:
$t_{OX}$=Oxide layer thickness=13 nm=$13 \times 10^{-7}$ cm
A: Area=1 cm$^2$
$N_A$: Acceptor concentration of p layer=$5 \times 10^{18}$ cm$^{-3}$
$N_D$: Donor concentration of n layer=$2 \times 10^{17}$ cm$^{-3}$ $$\therefore X_{bi} = (2\varepsilon_O \cdot \varepsilon_{SiC} \cdot V_{bi} / q)^{1/2} \times (1/N_A + 1/N_D)^{1/2}$$
$$= 0.12 \text{ μm} = 0.12 \times 10^{-4} \text{ cm}$$

$$C_{bi} = \frac{\varepsilon_O \cdot \varepsilon_{SiC}}{X_{bi}} A$$
$$= 72 \times 10^{-9} \text{ F}$$

$$C_{OX} = \frac{\varepsilon_O \cdot \varepsilon_{OX}}{t_{OX}} A$$
$$= 804 \times 10^{-9} \text{ F}$$

$$\therefore \frac{1}{C_{GS}} = \frac{1}{C_{OX}} + \frac{1}{C_{bi}}$$
$$= 1.2 \times 10^5 + 14 \times 10^5 = 15.2 \times 10^5$$

$$\therefore C_{GS} = 66 \times 10^{-9}$$

Thus, it is seen that this value is a quite low value, as compared with the value (=804 nF) when there is no capacitance relaxation region.

[Embodiment 4]

Figure 5:
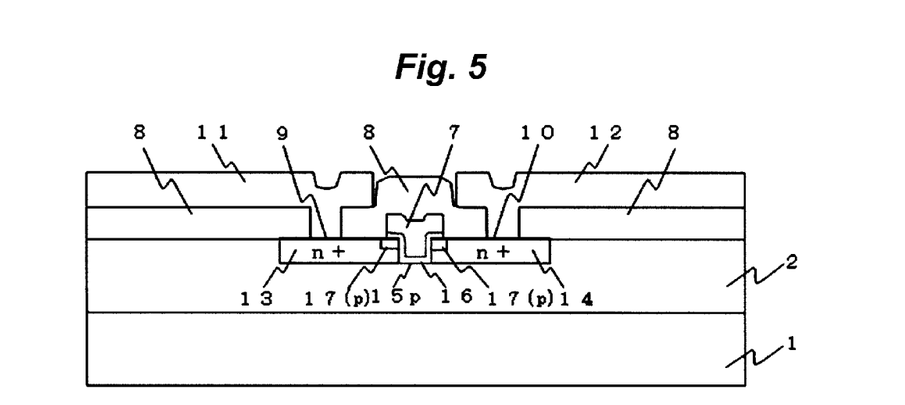
FIG. 5 is a cross-sectional view showing an example of a SiC MISFET to which Embodiment 4 of the present invention is applied.

FIG. 5 show an example of a SiC MISFET according to Embodiment 4. In this device, in addition to the device structure shown in FIG. 3, p-type regions 17, 17 are formed along edges of the source and drain regions in the respective surface portion of the source and drain regions 13, 14 overlapping the gate electrode 7 on the one main face of the SiC semiconductor region 2. Also in this case, gate electrode overlap capacitance can be reduced, similar to Embodiment 4.

Hereinafter, an example of a method of fabricating the SiC MISFET shown in FIG. 4 will be described with reference to FIGS. 6 to 12.

Figure 6:
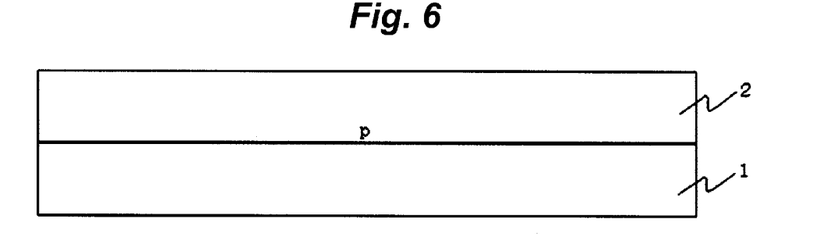
FIG. 6 is a process diagram showing an example of a method of producing the SiC MISFET shown in FIG. 4.

First, as shown in FIG. 6, a SiC base having the p-type SiC semiconductor region 2 formed on the SiC substrate 1 is provided. Herein, the SiC substrate 1 is any of a p-type, n-type or semi-insulating type. A crystal face of the SiC substrate is a (0001) Si face or a (000-1) C face, or may have another face orientation. Further, the p-type SiC semiconductor region 2 is an active layer in which a region constituting the device is formed. For example, the p-type SiC semiconductor region 2 is composed of an epitaxial grown layer doped with an impurity concentration of about $5 \times 10^{15}$/cm$^3$ and having a thickness of 10 μm.

Figure 7:
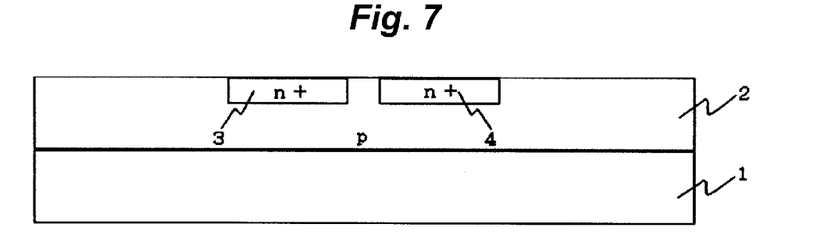
FIG. 7 is a process diagram showing an example of the method of producing the SiC MISFET shown in FIG. 4.

Next, as shown in FIG. 7, n+ type source and drain regions that are in contact with one main face of the SiC semiconductor region 2 and are spaced from and face each other, are selectively formed in the SiC semiconductor region 2. As a selectively forming means, use may be made of a method of the steps of: forming an insulating layer composed, for example, of an oxide layer on the one main face of the SiC semiconductor region 2; making openings in the insulating layer on the respective regions in which the source and drain regions 3, 4 are to be formed, by using a photolithography technique, to thereby form a mask (not shown); and then, ion-implanting, for example, P (phosphorus) as an n-type impurity. Impurity concentrations of the source and drain regions 3, 4 each may be about $1 \times 10^{20}$/cm$^3$, and depths thereof each may be 250 nm.

Figure 8:
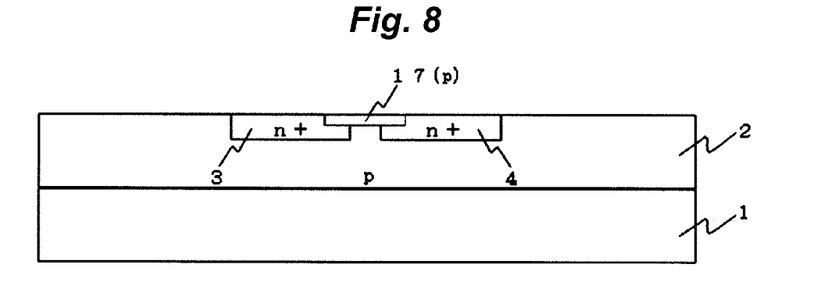
FIG. 8 is a process diagram showing an example of the method of producing the SiC MISFET shown in FIG. 4.

Then, as shown in FIG. 8, the p-type region 17 is selectively formed to be adjacent to the one main face of the SiC semiconductor region 2 and to extend over the source and drain regions 3, 4. A selectively forming method is the same as that used in FIG. 7. For example, Al (aluminum) is ion-implanted as a p-type impurity. A depth of the region 17 may be about 100 nm, and an impurity concentration thereof may be $1 \times 10^{18}$/cm$^3$.

Then, the base is annealed, for example, for 30 minutes at 1,600° C., to thereby activate the implanted n-type and p-type impurities.

Figure 9:
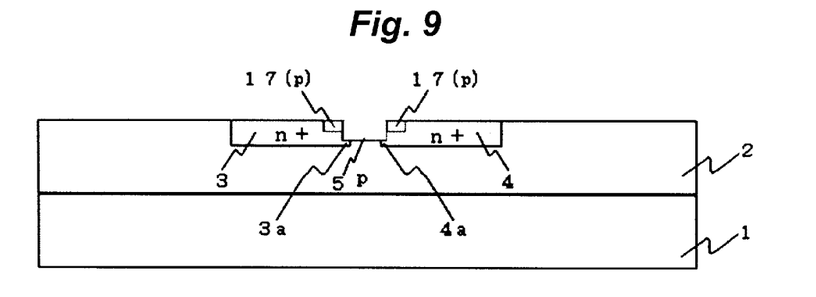
FIG. 9 is a process diagram showing an example of the method of producing the SiC MISFET shown in FIG. 4.

Next, as shown in FIG. 9, the SiC semiconductor region 2 extending over the source and drain regions 3, 4 is selectively removed from the one main face to a predetermined depth, to form the recess 5. Herein, the selective removal may be performed by dry etching, using a mask (not shown) having an opening formed in an insulating layer composed, for example, of an oxide layer, which is formed on the one main face of the SiC semiconductor region 2. As a result of forming the recess 5, the single p-type region 17 formed in the step of FIG. 8 is divided into the regions 17, 17 that are in contact with the source region 3 and the drain region 4, respectively, to form the capacitance relaxation regions 17, 17, and a structure is obtained, in which one side face of the recess 5 is in contact with the source region 3 and the p-type region 17 in contact with the source region 3, the other side face is in contact with the drain region 4 and the p-type region 17 in contact with the drain region 4, and the bottom face of the recess 5 is in contact with thin regions 3a and 4a in portions of the source and drain regions in the vicinity of both ends of the bottom face.

Figure 10:
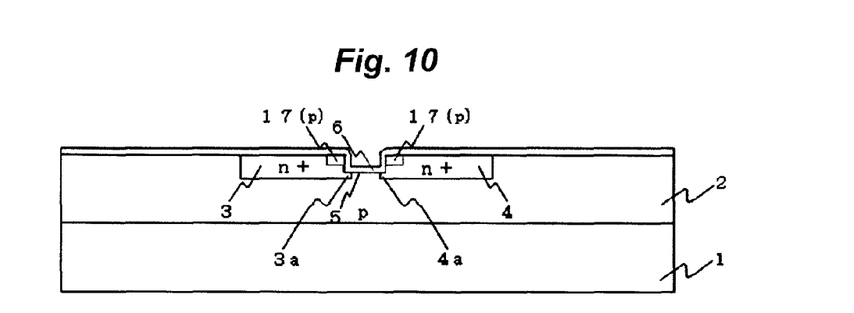
FIG. 10 is a process diagram showing an example of the method of producing the SiC MISFET shown in FIG. 4.

In the step of FIG. 10, the silicon oxide layer 6 is formed on the surface of the SiC semiconductor region 2. The thickness of the silicon oxide layer 6 may be 13 nm.

Figure 11:
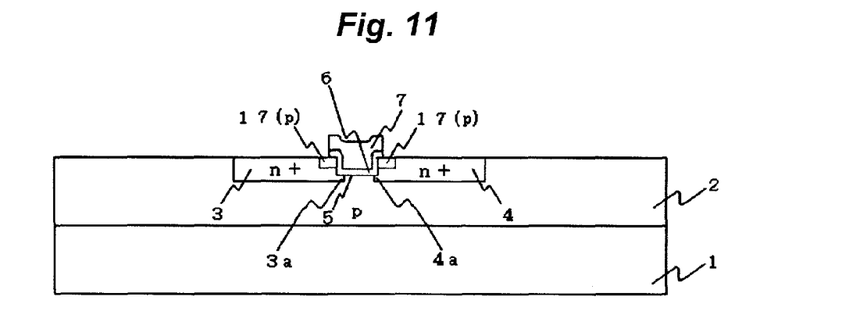
FIG. 11 is a process diagram showing an example of the method of producing the SiC MISFET shown in FIG. 4.

In the step of FIG. 11, first, a polysilicon layer is formed on the oxide layer 6, followed by patterning with a mask (not shown) formed on the polysilicon layer by a photolithography technique (i.e. the selective removal of the polysilicon layer), to form the gate electrode 7 composed of polysilicon. In the course of or after the formation of the polysilicon layer, the polysilicon layer is doped with an n-type impurity at a concentration of $1 \times 10^{20}$/cm$^3$. The underlying oxide layer 6 is selectively removed with the thus-patterned gate electrode 7 as a mask, to thereby define the gate oxide layer 6.

Figure 12:
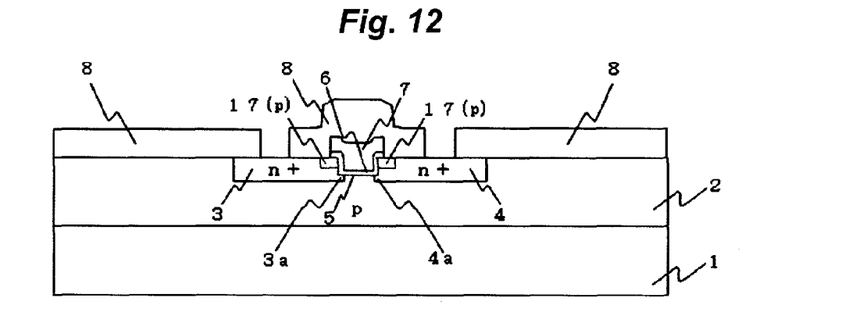
FIG. 12 is a process diagram showing an example of the method of producing the SiC MISFET shown in FIG. 4.

In the step of FIG. 12, the insulating layer 8 composed of a silicon oxide layer is formed on the surface of the SiC semiconductor region 2, and openings are formed in portions of the insulating layer 8 located on the source and drain regions.

Source and drain electrodes 11, 12 electrically connected to the source and drain regions, respectively, are formed through the openings of the oxide layer 8 formed in the step of FIG. 12, thereby to give the device (see FIG. 1). The source and drain electrodes are also formed by patterning of an electrode material layer using a mask. As the source and drain electrode material, any of Al (aluminum) and Ni (nickel) may be used. After the material is subjected to deposition, followed by subjecting to a high-temperature treatment at about 1,000° C., to thereby make low-resistance contacts on the surfaces of the source and drain regions in the openings of the oxide layer 8. The respective depth of the source and drain electrodes is about 1 μm.

The case where the capacitance relaxation regions 17, 17 are formed, is described in the example of the method of producing the SiC MISFET, as shown in FIGS. 6 to 12. In an alternative, for example, when the SiC MISFET is fabricated in a form having no capacitance relaxation regions as in the example shown in FIG. 1, the step of forming the p-type region 17 shown in FIG. 8 may be omitted.

Next, an example of a method of fabricating the SiC MISFET shown in FIG. 5 will be described with reference to FIGS. 13 to 16.

Figure 13:
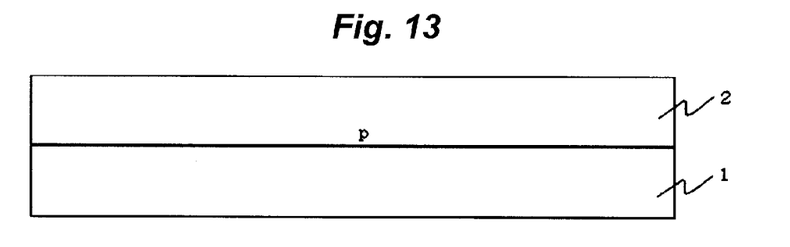
FIG. 13 is a process diagram showing an example of a method of producing the SiC MISFET shown in FIG. 5.

FIG. 13 shows the step of providing a starting material. Since this step is the same as the step of FIG. 6, a description thereof will be omitted.

Figure 14:
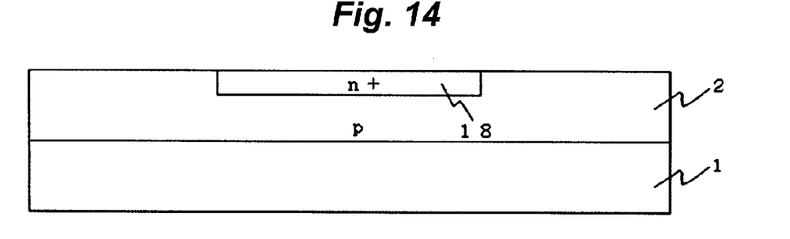
FIG. 14 is a process diagram showing an example of the method of producing the SiC MISFET shown in FIG. 5.

In the step of FIG. 14, the single n+ type region 18, which will constitute the source and drain regions in a later stage, is selectively formed on the surface of the semiconductor region 2. The selectively forming method, the n-type impurity material, the impurity concentration, and the depth are the same as those described with respect to the step of FIG. 7.

Figure 15:
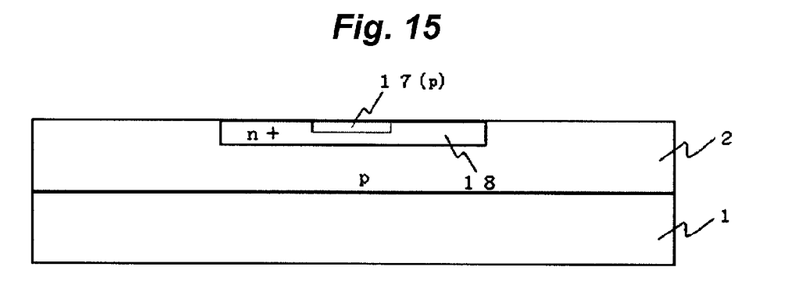
FIG. 15 is a process diagram showing an example of the method of producing the SiC MISFET shown in FIG. 5.

In the step of FIG. 15, the p-type region 17 is selectively formed, adjacent to the one main face of the semiconductor region 2, and in the n+ type region 18. The selectively forming method is the same as that used in FIG. 8, and the p-type impurity material, the impurity concentration, and the depth formed are the same as those described with respect to the step of FIG. 8.

Then, the base is annealed, for example, for 30 minutes at 1,600° C., to thereby activate the implanted n-type and p-type impurities.

Figure 16:
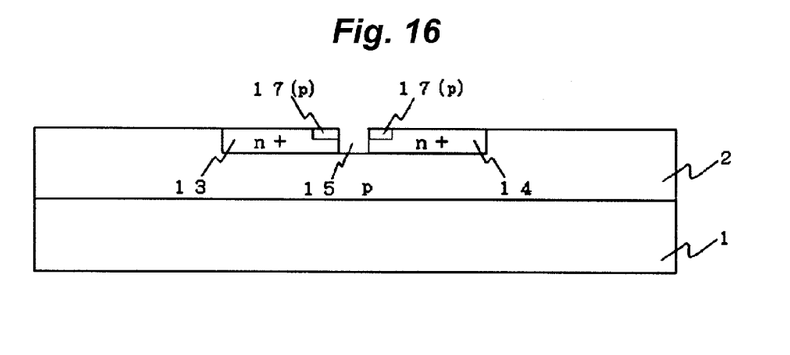
FIG. 16 is a process diagram showing an example of the method of producing the SiC MISFET shown in FIG. 5.

In the step of FIG. 16, the semiconductor region 2 is selectively removed from the one main face to a depth that is approximately equal to the depth (thickness) of the n+ type region 18, to form the recess 5. Herein, the selective removal may be performed by dry etching with a mask (not shown) having an opening formed in the insulating layer, which is composed, for example, of an oxide layer formed on the one main face of the semiconductor region 2. As a result of forming the recess, each of the single p-type region 17 and the n+ type region 18 formed in the steps of FIGS. 14 and 15 is divided into two regions, to form the source region 3 and the capacitance relaxation region 17 in contact with the source region, and a drain region 4 and the capacitance relaxation region 17 in contact with the drain region, and a structure is obtained, in which one side face of the recess is in contact with the source region 3 and the p-type region (capacitance relaxation region) 17 in contact with the source region, the other side face is in contact with the drain region and the p-type region (capacitance relaxation region) 17 in contact with the drain region, and the bottom face of the recess is adjacent to the semiconductor region 2 over the entire length of the bottom face.

Then, as described in the steps of FIGS. 10, 11 and 12, the gate oxide layer 6, the gate electrode 7, and the insulating layer 8 are formed, and the source and drain electrodes are finally formed, to give the device shown in FIG. 5.

The case where the capacitance relaxation regions 17, 17 are formed, is described in the example of the method of producing the SiC MISFET, as shown in FIGS. 13 to 16. In an alternative, for example, when the SiC MISFET is fabricated in a form having no capacitance relaxation regions as in the example shown in FIG. 3, the step of forming the p-type region 17 shown in FIG. 15 may be omitted.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2009-197601 filed in Japan on Aug. 28, 2009, which is entirely herein incorporated by reference.

| REFERENCE SIGNS LIST | |
|---|---|
| 1 | SiC substrate |
| 2 | SiC semiconductor region |
| 3, 13 | Source regions |
| 3a | Thin region of the source region |
| 4, 14 | Drain regions |
| 4a | Thin region of the drain region |
| 5, 15 | Recesses |
| 6, 16 | Gate insulating layers |
| 7 | Gate electrode |
| 8 | Insulating layer |
| 9, 10 | Contact openings |
| 11 | Source electrode |
| 12 | Drain electrode |
| 17 | Capacitance relaxation region |

The invention claimed is:

1. A recessed gate-type silicon carbide field effect transistor, comprising:
   a substrate (1) including a one-conductivity-type silicon carbide semiconductor region (2) having one main face;
   a source region and a drain region (3, 4) of an opposite-conductivity-type to the one-conductivity-type that each have an approximately same impurity concentration, and are formed in contact with the one main face and spaced from each other in the one-conductivity-type silicon carbide semiconductor region (2);
   a recess (5) formed in the one main face side of the one-conductivity-type silicon carbide semiconductor region (2) sandwiched between facing edges of the spaced source and drain regions (3, 4), the recess comprising a first side face in contact with the source region (3), a second side face in contact with the drain region (4), and a bottom face that is located at a predetermined depth from the one main face, continues to the first and second side faces, and connects the spaced source and drain regions (3, 4), to extend over the source and drain regions (3, 4);
   an insulating layer (6) covering a portion of the one main face with which the source and drain regions (3, 4) are in contact, and formed on the first and second side faces and the bottom face of the recess (5);
   a gate electrode (7) formed on the insulating layer (6); and
   a source electrode and a drain electrode (11, 12) electrically connected to the source and drain regions (3, 4),
   wherein a channel forming region is constituted at a portion of the silicon carbide semiconductor region adjacent to the main portion of the bottom face connecting the source and drain regions (3, 4), and
   wherein portions extended over the source and drain regions (3, 4) in the vicinity of both ends of the bottom face of the recess (5) are in contact with thin regions (3a, 4a) of the source and drain regions have the approximately same impurity concentration.

2. The recessed gate-type silicon carbide field effect transistor according to claim 1,
   wherein regions (17, 17) of the one-conductivity-type are formed in the source and drain regions (3, 4, 13, 14) beneath the gate electrode (7) formed on the insulating layer (6, 16) covering the portion of the one main face.

3. The recessed gate-type silicon carbide field effect transistor according to claim 2, wherein the region of the one-conductivity-type is composed of a p-type material.

4. The recessed gate-type silicon carbide field effect transistor according to claim 1, wherein the substrate is composed of p-type, n-type, or semi-insulating silicon carbide.

5. The recessed gate-type silicon carbide field effect transistor according to claim 1, wherein the silicon carbide semiconductor region is composed of a p-type material, and the source and drain regions each are composed of an n-type material.

6. The recessed gate-type silicon carbide field effect transistor according to claim 1, wherein the insulating layer has a first thickness to cover a portion of the one main face and a second thickness to cover the bottom face, in which the first thickness is thicker than the second thickness.

7. The recessed gate-type silicon carbide field effect transistor according to claim 1, wherein the insulating layer covering the bottom face is composed of a silicon dioxide layer.

8. A method of producing a recessed gate-type silicon carbide field effect transistor, comprising the steps of:
   providing a substrate including a one-conductivity-type silicon carbide semiconductor region having one main face;
   selectively forming a source region and a drain region of an opposite-conductivity-type to the one-conductivity-type at a first predetermined depth from the one main face in the one-conductivity-type silicon carbide semiconductor region, with the source and drain regions being in contact with the one main face and spaced from each other;
   selectively removing silicon carbide in a portion at which the spaced source and drain regions face each other, thereby to form a recess, with the recess comprising a first side face in contact with the source region, a second side face in contact with the drain region, and a bottom face that is located at a second predetermined depth from the one main face, continues to the first and second side faces, and connects the spaced source and drain regions;
   forming a first insulating layer that covers a portion of the one main face with which the source and drain regions are in contact, and is continuous on the first and second side faces and the bottom face of the recess;
   forming a gate electrode on the insulating layer;
   forming a second insulating layer that covers other portion of the one main face with which the source and drain regions are in contact;
   selectively removing the second insulating layer, thereby to form openings on the source and drain regions, respectively; and
   forming a source electrode and a drain electrode electrically connected to the source and drain regions through the openings, respectively.

9. The method of producing a recessed gate-type silicon carbide field effect transistor according to claim 8, further comprising the steps of:
   selectively forming a region of the one-conductivity-type with a smaller depth than the source and drain regions, to extend over the source and drain regions, after the step of forming the source and drain regions; and
   separating the region of the one-conductivity-type into two regions, in the step of forming the recess, with the two regions being in contact with the source and drain regions and facing along faces to which the source and drain regions face, respectively.

10. The method of producing a recessed gate-type silicon carbide field effect transistor according to claim 8, wherein the second predetermined depth is smaller than the first predetermined depth.

11. The method of producing a recessed gate-type silicon carbide field effect transistor according to claim 8, wherein the second predetermined depth is set to be approximately equal to the first predetermined depth.

12. The method of producing a recessed gate-type silicon carbide field effect transistor according to claim 8, wherein the substrate is composed of p-type, n-type, or semi-insulating silicon carbide.

13. The method of producing a recessed gate-type silicon carbide field effect transistor according to claim 8, wherein the silicon carbide semiconductor region is composed of a p-type epitaxial layer, and the source and drain regions each are composed of an n-type material.

14. The method of producing a recessed gate-type silicon carbide field effect transistor according to claim 8, wherein the second insulating layer is formed to be thicker than the first insulating layer.

15. A method of producing a recessed gate-type silicon carbide field effect transistor, comprising the steps of:
   providing a substrate including a one-conductivity-type silicon carbide semiconductor region having one main face;
   selectively forming a first region of an opposite-conductivity-type to the one-conductivity-type at a first predetermined depth from the one main face in the one-conductivity-type silicon carbide semiconductor region, with the region being in contact with the one main face;
   selectively forming a second region of the one-conductivity-type at a second predetermined depth from the one main face in the first region with the second predetermined depth being shallower than the first predetermined depth;
   selectively removing a portion of the second region of the one-conductivity-type and a portion of the first region beneath the thus-removed second region to an approximately equal depth to the first predetermined depth, thereby to form a recess, with the recess comprising a first side face and a second side face each in contact with the second region of the one-conductivity-type and the first region beneath the second region and a bottom face to continue the first and second side faces, and thereby to divide the first region into two regions with the two regions facing each other and being spaced from each other to define a source region and a drain region, and thereby to divide the second region into two regions with the two regions facing each other and being spaced from each other;
   forming a first insulating layer that covers a portion of the one main face with which the source and drain regions are in contact, and is continuous on the first and second side faces and the bottom face of the recess;
   forming a gate electrode on the insulating layer;
   forming a second insulating layer that covers other portion of the one main face with which the source and drain regions are in contact;
   selectively removing the second insulating layer, thereby to form openings on the source and drain regions, respectively; and
   forming a source electrode and a drain electrode electrically connected to the source and drain regions through the openings, respectively.

16. The method of producing a recessed gate-type silicon carbide field effect transistor according to claim 15, wherein the substrate is composed of p-type, n-type, or semi-insulating silicon carbide.

17. The method of producing a recessed gate-type silicon carbide field effect transistor according to claim 15, wherein the silicon carbide semiconductor region is composed of a p-type epitaxial layer, and the source and drain regions each are composed of an n-type material.

18. The method of producing a recessed gate-type silicon carbide field effect transistor according to claim 15, wherein the second insulating layer is formed to be thicker than the first insulating layer.

* * * * *